(12) United States Patent
Watanabe et al.

(10) Patent No.: US 7,488,103 B2
(45) Date of Patent: Feb. 10, 2009

(54) LIGHTING DEVICE WITH LIGHT GUIDE PLATE ILLUMINATED BY LED

(75) Inventors: Kiyokazu Watanabe, Fujiyoshida (JP); Toshinobu Katsumata, Fujiyoshida (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 147 days.

(21) Appl. No.: 11/517,775

(22) Filed: Sep. 8, 2006

(65) Prior Publication Data
US 2007/0058392 A1    Mar. 15, 2007

(30) Foreign Application Priority Data
Sep. 9, 2005    (JP) .............................. 2005-263081

(51) Int. Cl.
*F21V 7/04*    (2006.01)

(52) U.S. Cl. ...................... 362/607; 362/609; 362/610; 362/612

(58) Field of Classification Search ................. 362/607, 362/609, 612, 613, 606, 608, 610
See application file for complete search history.

(56) References Cited

U.S. PATENT DOCUMENTS

| | | | |
|---|---|---|---|
| 5,769,521 A * | 6/1998 | Osawa et al. ................ 362/612 |
| 5,786,665 A * | 7/1998 | Ohtsuki et al. .............. 362/612 |
| 5,883,684 A * | 3/1999 | Millikan et al. ............. 362/612 |
| 6,508,564 B1 * | 1/2003 | Kuwabara et al. ........... 362/612 |
| 7,040,794 B2 * | 5/2006 | Bernard ...................... 362/607 |
| 7,123,316 B1 * | 10/2006 | Yang et al. ................... 362/609 |
| 7,182,499 B2 * | 2/2007 | Chen et al. ................... 362/607 |
| 2002/0001192 A1 * | 1/2002 | Suehiro et al. ................ 362/31 |
| 2004/0061440 A1 | 4/2004 | Imai et al. |
| 2007/0008739 A1 * | 1/2007 | Kim et al. .................... 362/612 |
| 2007/0121343 A1 * | 5/2007 | Brown ......................... 362/612 |
| 2007/0139961 A1 * | 6/2007 | Cheah et al. ................. 362/612 |
| 2007/0274095 A1 * | 11/2007 | Destain ....................... 362/609 |
| 2008/0007963 A1 * | 1/2008 | Hsieh .......................... 362/607 |

* cited by examiner

*Primary Examiner*—Ismael Negron
(74) *Attorney, Agent, or Firm*—Brinks Hofer Gilson & Lione

(57) ABSTRACT

A lighting device for a liquid crystal display and the like comprises: a light guide plate having a top surface serving as a light exiting surface, a bottom reflective surface and a circumferential surface; and a least one LED unit disposed adjacent to the circumferential surface of the light guide plate. The LED unit comprises at least one LED chip, a light emission section facing the circumferential surface of the light guide plate, and a substrate is disposed on and covering the back surface of the light emission section and electrically connected to the LED chip. A flat reflective member is disposed over a top of the light emission section and extending in parallel with and partly overlapping the light guide plate's top surface adjacent to the circumferential surface which faces the LED unit.

9 Claims, 9 Drawing Sheets

Light Emission Angle θ (deg)

LIGHTING DEVICE WITH LIGHT GUIDE PLATE ILLUMINATED BY LED

This application claims priority under 35 U.S.C. § 119 to Japanese Patent Application No. JP2005-263081 filed Sep. 9, 2005, the entire content of which is hereby incorporated by reference.

BACKGROUND OF THE INVENTION

1. Field of the Invention

The present invention relates to a lighting device for a non-self-emitting display such as a small-size liquid crystal display used in a cellular phone, a PDA and so on.

2. Description of the Related Arts

In recent years, such a lighting device has employed a light emitting diode (hereinafter abbreviated as "LED") for a light source thereof.

FIG. 6a and FIG. 6b show a typical type of the lighting device with LEDs. The lighting device comprises a plurality of LED units 64-1, 64-2, 64-3 and 64-4, all of which are placed adjacent to a side edge surface 63 of a rectangular light guide plate so that light exiting from the LED unit 64-1, 64-2, 64-3 and 64-4 enters the light guide plate 10 through the side edge surface 63. The light guide plate 10 includes reflective prisms 62 formed on a bottom surface thereof which are successively arranged from the side edge surface 63 to the opposite side edge surface 65.

As shown in FIG. 6b, there are provided a reflecting sheet 16 below the light guide plate 10 and a diffusion sheet 70 and prism sheets 68 and 66 above the same and all of those elements are accommodated in a housing 60. A non-self-emitting display such as a liquid crystal display is placed on top of the housing.

FIG. 7a illustrates a behavior of the light for illumination. A light 15 from the LED unit 64 that has entered the light guide plate 10 advances in the light guide plate 10 while repeatedly bouncing between reflective prisms 62 arranged in the lower surface of the light guide plate and an upper surface of the light guide plate. During the repeated bouncing, an angle of incidence of the light impinging on the upper surface of the light guide plate is gradually made small and finally become smaller than a critical angle, thereby allowing the light to exit upward through the upper surface of the light guide plate. In addition, the light that may exit from the lower surface of the light guide plate is to be reflected by the reflecting sheet 16 and returned to the light guide plate 10. The light exited from the light guide plate 10 may be diffused by the diffusion sheet 70 and then directed toward a non-self-emitting display 74 by the prism sheets 68 and 66 so as to illuminate the display.

It is to be noted that reference numeral 20 designates a flexible printed circuit board serving for establishing an electric connection between the LED unit and an external device.

Referring now to FIGS. 8a and 8b, coordinate axes used in the present specification are illustrated. Z-axis extends from an LED unit 64, which comprises an emission section 76 and a substrate section 12, toward the light guide plate 10 and perpendicularly to the side edge surface 63 of the light guide plate 10, X-axis is orthogonal to the Z-axis and extending in parallel to the side edge surface 63 of the light guide plate 10, and Y-axis is orthogonal to the Z-X plane.

Further, referring to FIG. 8b, with regard to the light emitted from the LED unit 64, an angle between a component X' of the light projected onto the X-Z plane and the Z-axis and an angle between a component Y' of the light projected onto the Y-Z plane and the Z-axis are both denoted by θ which will be referred to as "light emission angle" hereinunder.

FIG. 7b is a diagram representing the directivity of the light emitted from the LED unit as shown in FIG. 7a. In the diagram, the lateral axis represents the light emission angle θ, and the vertical axis represents ratio of the light intensity of the components of the light projected on the X-Z plane and the Y-Z plane wherein the ratio of the component of the light emission angle θ equal to zero is defined as 1. As can be seen from the diagram, the profiles of the ratios of the light intensity of the components are substantially the same and therefore represented by a single curve.

FIG. 9a is a perspective view of the LED unit 64, FIG. 9b shows the LED unit 64 viewed from the right side along the Z-axis, FIG. 9c is a sectional view of the LED unit 64 in an approximately central region taken along a plane (horizontal plane) parallel to the X-Z plane, and FIG. 9d shows the LED unit 64 viewed from the left side along the Z-axis.

The substrate section 12 comprises a substrate 26 having internal terminals 32 and external terminals 34 which are electrically connected by vias 36 formed in the substrate 26. The emission section 76 comprises a light shielding wall 78 in the shape of a rectangular cylinder and a resin block 80 filling up the interior space in the light shielding wall 78. Within the resin block 80 are embedded a LED chip 28 mounted on the substrate 26 and gold wires 30 connecting the internal terminals 32 with the LED chip 28. The resin block 80 has a front surface 77, which faces to the light entering surface of the light guide plate, and thus, the front surface 77 serves as an emission surface for the light emitted from the LED chip 28 toward the light guide plate.

With reference to FIG. 10a, a diffused light emitted from the LED unit 64 is as indicated by a shaded triangle 22 enters the light guide plate 10 and contributes as the light for illumination. However, other light diffused outside the shaded triangle 22 will not enter the light guide plate 10, thereby not being used for illumination. FIG. 10b shows such a matter by using the same diagram as that of FIG. 7b, i.e., the light indicated by shaded portions 78, 80 is not be used for illumination.

The quantity of the light that cannot be used for illumination may increase or decrease in dependence on a distance L1, between the LED unit 64 and the light guide plate 10 and a thickness T, of the light guide plate as shown in FIG. 10a.

If the distance L1 is made zero, all of the light could be taken into the light guide plate. However, in actuality, it is impossible to make the distance L1 zero in the lighting device.

In addition, if the thickness T of the light guide plate is made thicker, more light could be taken into the light guide plate to be used for illumination. However, the thickness T is not allowed to be increased for the recent trend of a lower profile of the lighting device, which has been desired in association with the demand for a low-profile, lighter portable device. Actually, it is said that in order to reduce the thickness of the lighting device by 20% to 30%, the thickness of the light guide plate is needed to be reduced by around half.

Unfortunately, as described with reference to FIG. 10, if the thickness of the light guide plate is decreased, less light is taken into the light guide plate.

Accordingly, although there is the trend to make the lighting device thinner, it will deteriorate the emission efficiency of the light source, and, therefore, it is impossible to establish the coexistence of "making thinner" and "making brighter" in the lighting device.

In connection with the lighting device with LEDs, there has been a proposal for solving a problem inherent to the lighting device that there appear dark regions or low brightness regions on the light exiting surface of the light guide plate at locations between the LEDs and adjacent to the side edge surface of the light guide plate along which the LED units are arranged. According to the proposal, the upper and lower surfaces of the emission section of the LED unit are mirror-finished or provided with light shielding layers made from material having a high reflectance without subjecting the left and right side surfaces to such treatment (see, for example, Japanese Patent Laid-open Publication No. 2004-127604). The treatments as stated above are not easy but expensive.

SUMMARY OF THE INVENTION

An object of the present invention is to provide a lighting device which is of low-profile and inexpensive and has a higher intensity of illumination.

According to the present invention, a lighting device comprises:
- a light guide plate having a top surface serving as a light exiting surface, a bottom surface serving as a reflective surface and a side surface serving as a light entering surface;
- at least one LED unit disposed adjacent to the light entering surface of the light guide plate, comprising:
- an emission section comprising a transparent or translucent member having a front surface facing the side surface of the light guide plate, a back surface opposite to the front surface, and a circumferential surface extending between the front surface and the back surface;
- an LED chip embedded within the emission section; and,
- a substrate disposed on and covering the back surface of the transparent or translucent member and electrically connected to the LED chip; and
- a flat reflective member provided separately from the LED unit and disposed over a top side of the circumferential surface and extending in parallel with the top surface of the light guide plate so as to cover a region of the top surface of the light guide plate adjacent to the light entering surface of the light guide plate.

Compared to a conventional LED unit with the reflective member formed on an overall circumferential surface of the emission section of the LED unit, an LED unit according to the present invention can be inexpensive. In addition, since the leak light upward from the emission section can be reflected and returned to the light guide plate, light can be effectively supplied to the light guide plate. Further, since light can be emitted from a left side and a right side of the circumferential surface of the emission section of the LED unit according to the present invention, dark regions or low brightness regions emerging on the light exiting surface of the light guide plate between the LEDs at adjacent area to the side edge surface of the light guide plate can be prevented. Specifically, the reflective member may have a width at least as wide as that of the emission section.

Preferably, the lighting device comprises a reflective plate disposed beneath and adjacent to the bottom surface of the light guide plate and extending toward the substrate of the LED unit under the emission section of the LED unit, thereby utilizing the light from the LED unit more effectively.

The reflective member may be made of a reflective sheet. This may reduce the cost to form the reflective layer.

In addition, the reflective member may have a surface on which an array of reflective prisms are formed so that the reflective prisms facing the emission section deflect light exiting from the circumferential surface of the emission section toward the front surface side of the emission section. Thus, this can reduce a number of bouncing of the light in the emission section, thereby enabling the light to be more effectively supplied to the light guide plate.

Further, the lighting device may comprise a flexible printed circuit board that is attached to and the electrically connected to the LED chip through the substrate, the flexible printed circuit board extending toward and in parallel with the top surface of the light guide plate, wherein the reflective sheet is disposed between and in contact with the flexible printed circuit board and the LED unit.

Still further, the reflective member facing the LED unit may be formed on a surface of the flexible printed circuit board.

Thus, according to the present invention, even if the light guide plate is made thinner, the light from the LED unit can be still effectively supplied to the light guide plate for illumination, and the light can be additionally emitted from the left and the right of the emission section of the LED unit, so that it can prevent the dark regions or low brightness regions from emerging between the LED unit, in an area of the light exiting surface of the light guide plate adjacent to the LED unit. In addition, since the reflective layer is provided separately from the LED unit, it can be inexpensive.

BRIEF DESCRIPTION OF THE DRAWINGS

FIG. 1b is a partial sectional view illustrating a variation of the device of FIG. 1a;

FIG. 4b shows a light exiting surface of the LED unit of FIG. 4a;

FIG. 4c is a sectional view taken along the X-Z plane of the LED unit of FIG. 4a;

FIG. 4d is a back view of the LED unit of FIG. 4a;

FIG. 5b is a diagram illustrating an emission angle characteristic of a LED unit as shown in FIG. 5a;

FIG. 6b is a side view of the lighting device of FIG. 6a;

FIG. 7a is a schematic view for illustrating a behavior of an illumination light in the lighting device as shown in FIG. 6a;

FIG. 7b is a diagram illustrating a directivity of a light from an LED unit of the lighting device of FIG. 6a;

FIG. 8b is a diagram for illustrating an emission angle "θ" of a light emitted from an LED unit and directed toward an light guide plate, with respect to the coordinate axes shown in FIG. 8a;

FIG. 9b shows a light emitting surface of the LED unit of FIG. 9a;

FIG. 9c is a sectional view taken along the X-Z plane of the LED unit of FIG. 9a;

FIG. 9d is a back view of the LED unit of FIG. 9a;

FIG. 10b is a diagram for illustrating the problem associated with the lighting device of FIG. 10a.

DESCRIPTION OF THE PREFERRED EMBODIMENTS

Embodiments of the present invention will be explained below with reference to the accompanying drawings.

Figure 4A:
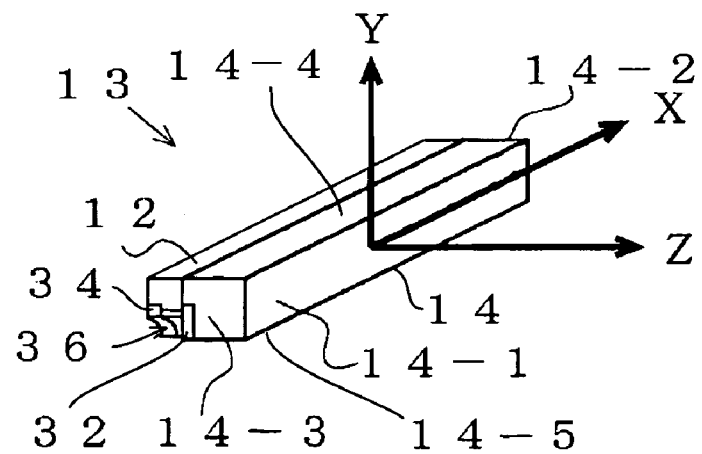
FIG. 4a is a perspective view illustrating an LED unit used in the present invention.
Figure 4B:
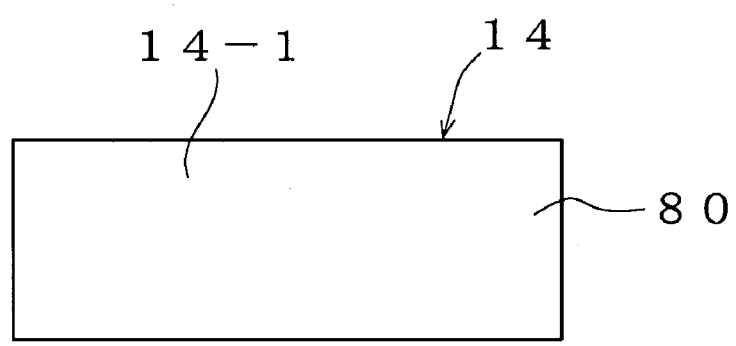
Figure 4C:
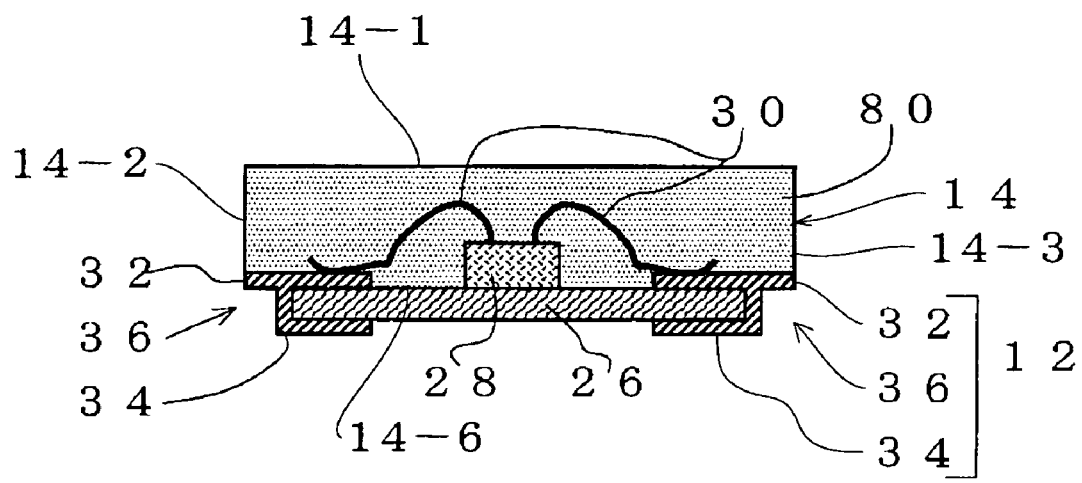
Figure 4D:
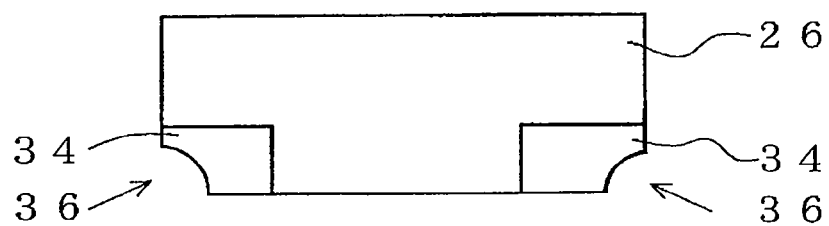

LED unit shown in FIG. 4a is a perspective view of the LED unit 13; FIG. 4b shows the LED unit 13 viewed from the right side along the Z-axis; FIG. 4c is a sectional view of the LED unit 13 taken along a plane parallel to the X-Z plane; and FIG. 4d shows the LED unit 13 viewed from the left side along the Z-axis.

As illustrated, the LED unit 13 comprises a substrate section 12 and an emission section 14. The substrate section 12 comprises a substrate 26 on which a LED chip 28 is mounted, internal terminals 32 disposed on an inner surface of the substrate 26, and external terminals 34 on an outer surface of the substrate 26. The internal terminals 32 and the corresponding external terminals 34 are interconnected by vias 36, respectively. At least one LED chip 28 is mounted on the substrate, and gold wires 30 for connecting the internal terminals 32 with terminals of the LED chip 28.

The emission section 14 comprises a transparent resin block 80, and, the LED chip 28, and gold wires 30 connecting the internal terminals 32 with the LED chip 28 which are embedded in the transparent or translucent resin block 80, which protects all the elements embedded therein and controls the illumination color. The emission section 14 is configured such that in operation, the light can exit not only from a front surface of the resin block 80 facing to light guide plate but also from a top side 14-4, a bottom side 14-5, a left side 14-3 and a right side 14-2 of the same, while the back surface 14-6 is covered by the substrate 26 fixedly attached thereto. As shown in FIG. 4d, the external electrode 34 of the substrate 26 and the via 36 for connecting the external electrode 34 with the internal electrode 32 are seen in the back surface of the LED unit 13.

As apparent from the comparison of FIGS. 4a-4d to FIGS. 9a-9d, the LED unit 13 used in the present invention as shown in FIGS. 4a-4d has advantageously employed five of the six surfaces thereof as the emission surfaces by removing the light shielding surface 78 in association with the conventional LED unit 64 as shown in FIGS. 9a-9d.

Figure 9A:
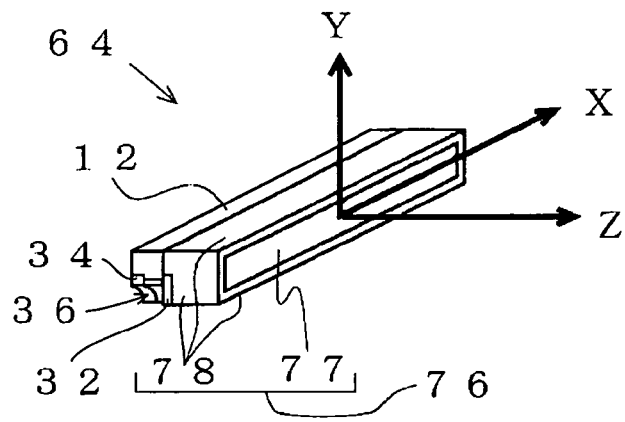
FIG. 9a is a perspective view illustrating an LED unit with a shading wall provided on an overall circumferential surface of the emission section of the LED unit.
Figure 9B:
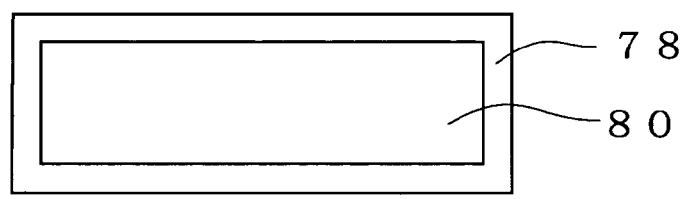
Figure 9C:
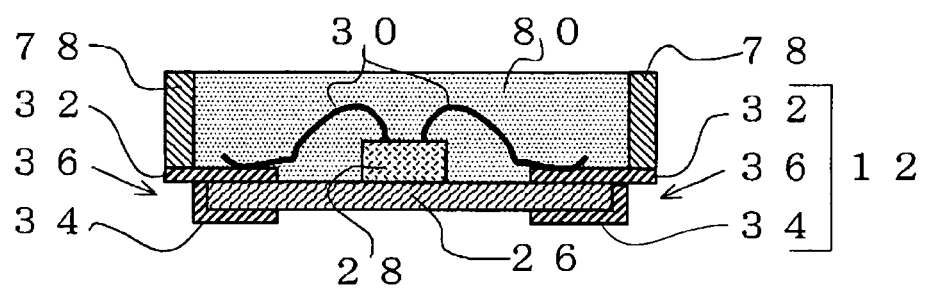
Figure 9D:
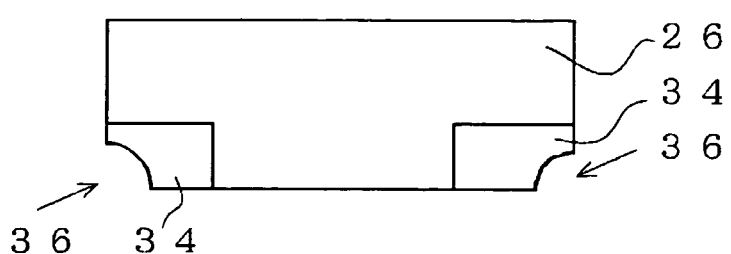

As a result of measurement, it has been found that this configuration of the present invention can increase a total volume of light emitted from the emission section by a multiple of 1.3 to 1.4 over the conventional LED unit 64 that has employed one of the six surfaces of the emission section. Incidentally, it has also been found that when the LED unit of FIG. 9a is modified by removing the left and right side shading surfaces retaining the upper and lower shading surfaces, a total volume of light exiting therefrom increases by a multiple of 1.1.

If the LED unit 13 is applied to a lighting device having the conventional configuration as stated above, however, the quantity of light entering the light guide plate could decrease as explained below.

Figure 5A:
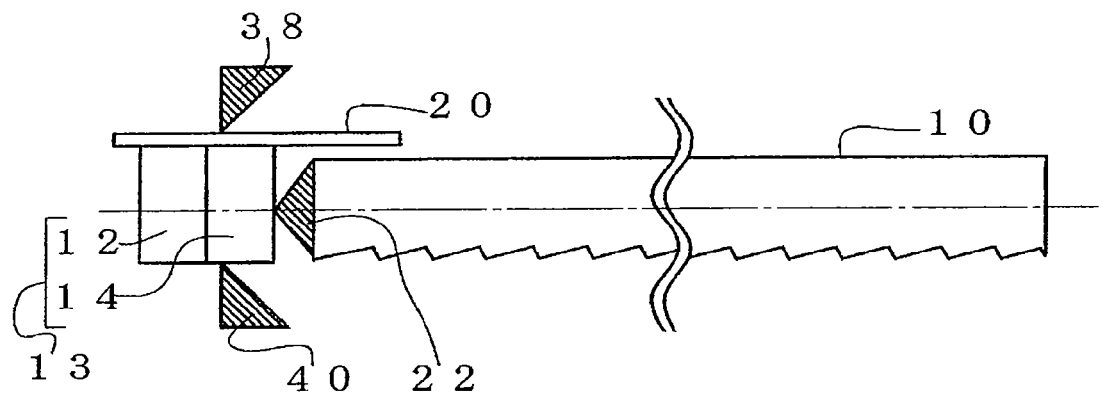
FIG. 5a is a schematic view for illustrating how a light is emitted in case an LED unit, used in the present invention, is applied to a conventional lighting device.
Figure 5B:
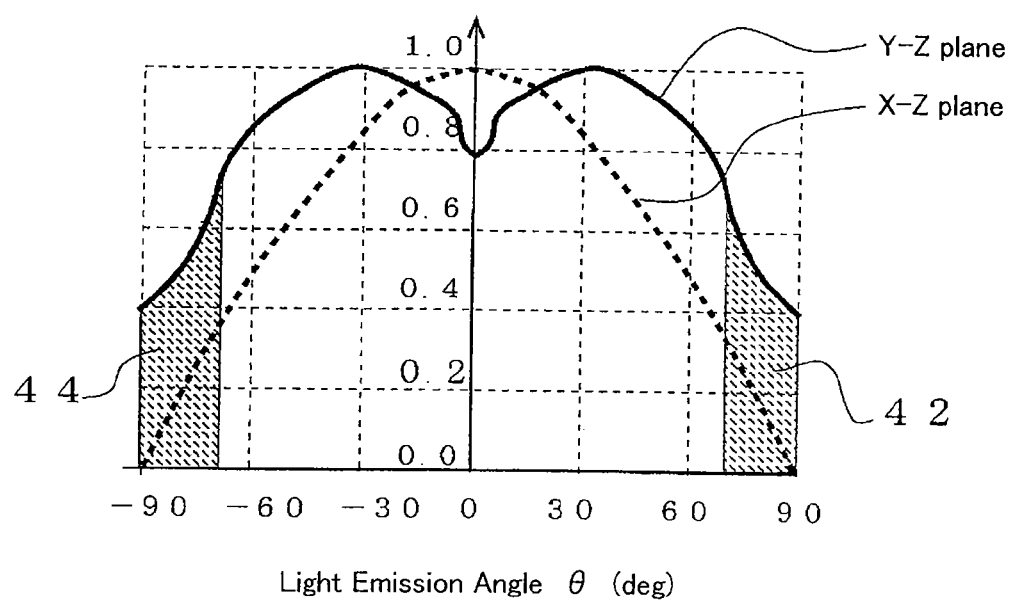
Figure 10A:
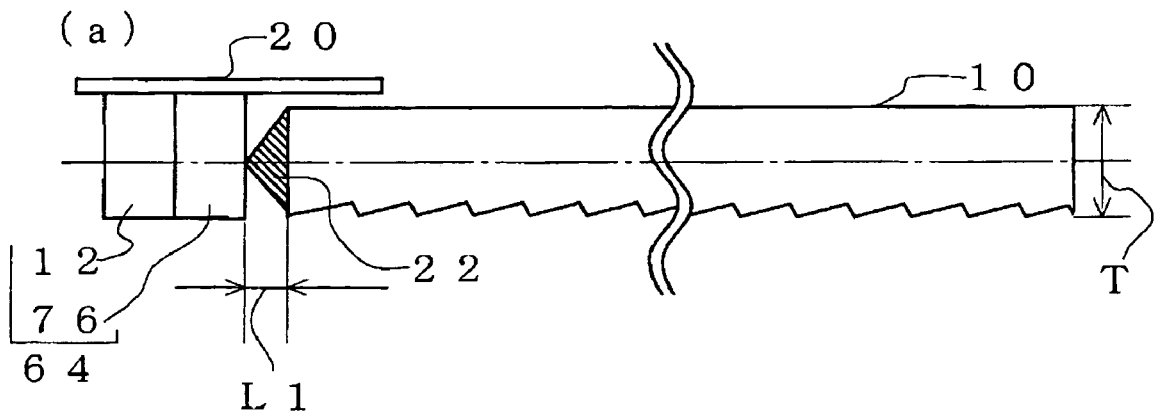
FIG. 10a is a schematic side view of the lighting device for explaining a problem associated with the device.
Figure 10B:
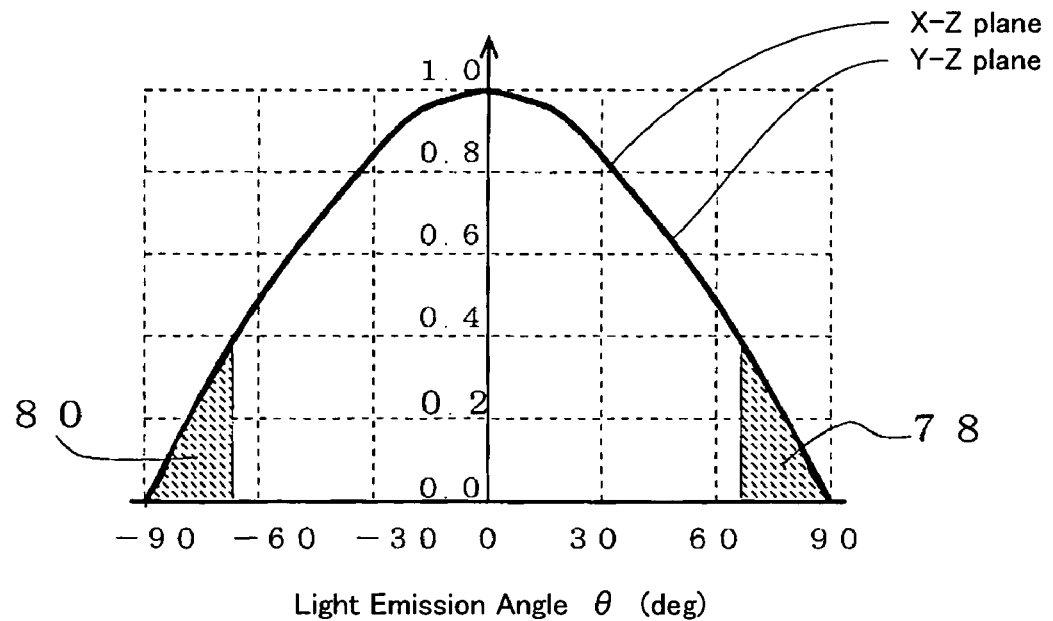

Similarly to FIG. 10b, FIG. 5b is a diagram for illustrating the directivity of the light directed toward the light guide plate 10 by taking the front surface 14-1 facing to the light guide plate 10 as a reference, and it can be seen from the diagram that the quantity of light spreading in the left and the right sides with respect to the direction of θ=0 in the Y-Z plane increases. Specifically, the characteristic on the Y-Z plane exhibits peaks, i.e., 1 of the relative intensity at + and −35 degrees and around 0.4 of the relative intensity even at + and −90 degrees as indicated by a solid line, while the characteristic on the X-Z plane exhibits substantially the same characteristic as in the conventional device as indicated by a dotted line. Reference numerals 22, 38 and 40 in FIG. 5a symbolically represent the manner in which the light exits from the LED unit 13. Namely, when the LED unit 13 is placed in relation to the light guide plate 10 as shown in FIG. 5a, the light denoted by 38, 40 does not enter the light guide plate 10, thereby not being used for illumination.

The present invention intends to achieve a low-profile lighting device with LED units 13 as shown in FIG. 4 which device is capable of highly intensive illumination.

Figure 1A:
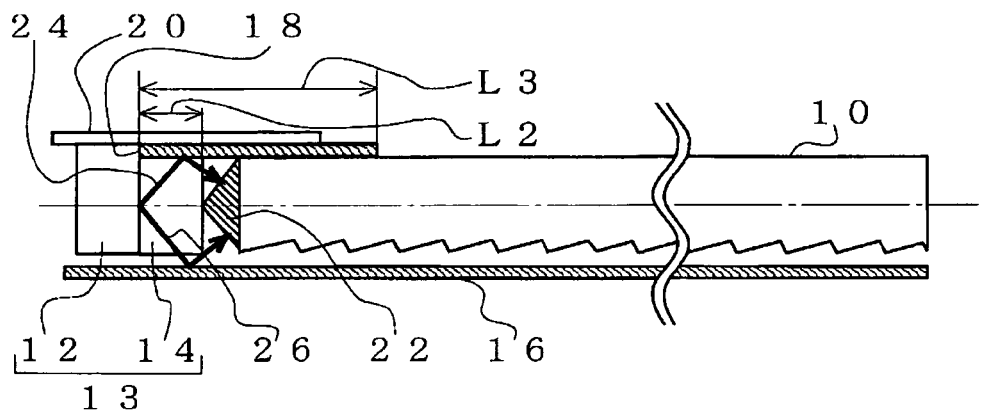
FIG. 1a is a partial sectional view illustrating a lighting device of a first embodiment of the present invention.

FIG. 1a is a partial sectional view of a lighting device according to a first embodiment of the present invention.

Figure 6A:
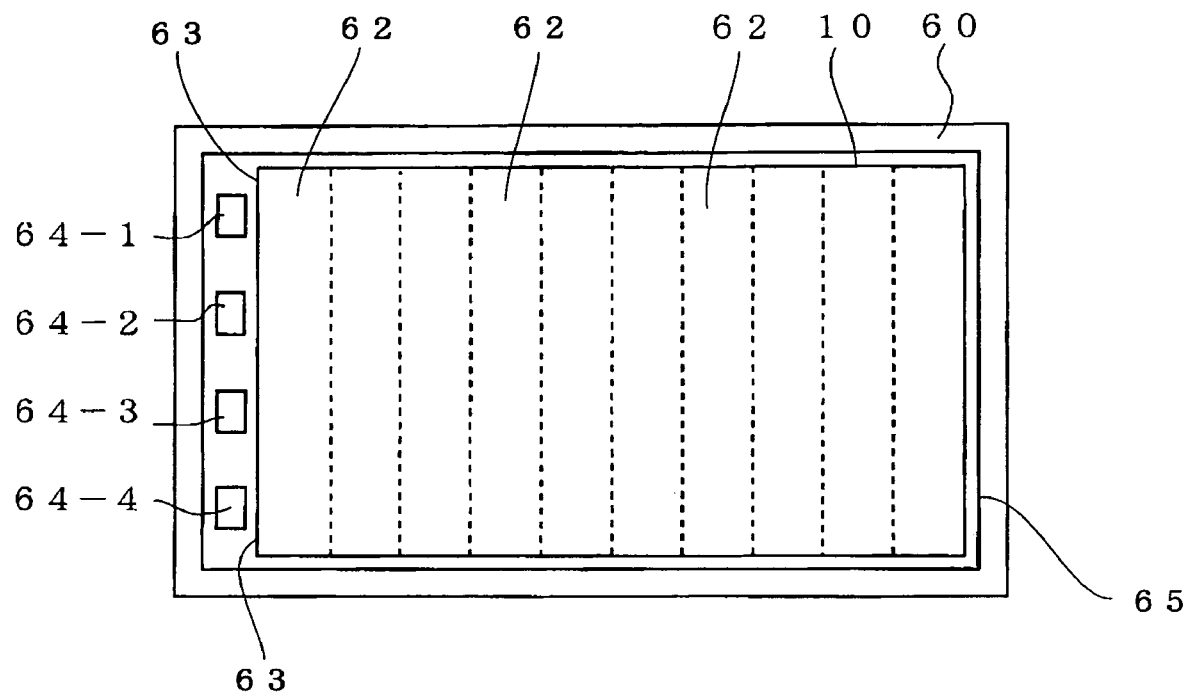
FIG. 6a is a plan view of a conventional lighting device.
Figure 6B:
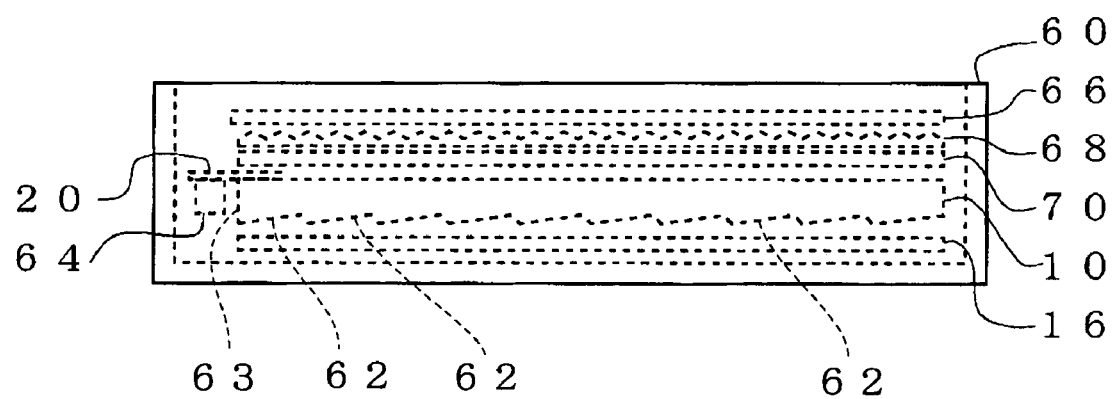
Figure 7A:
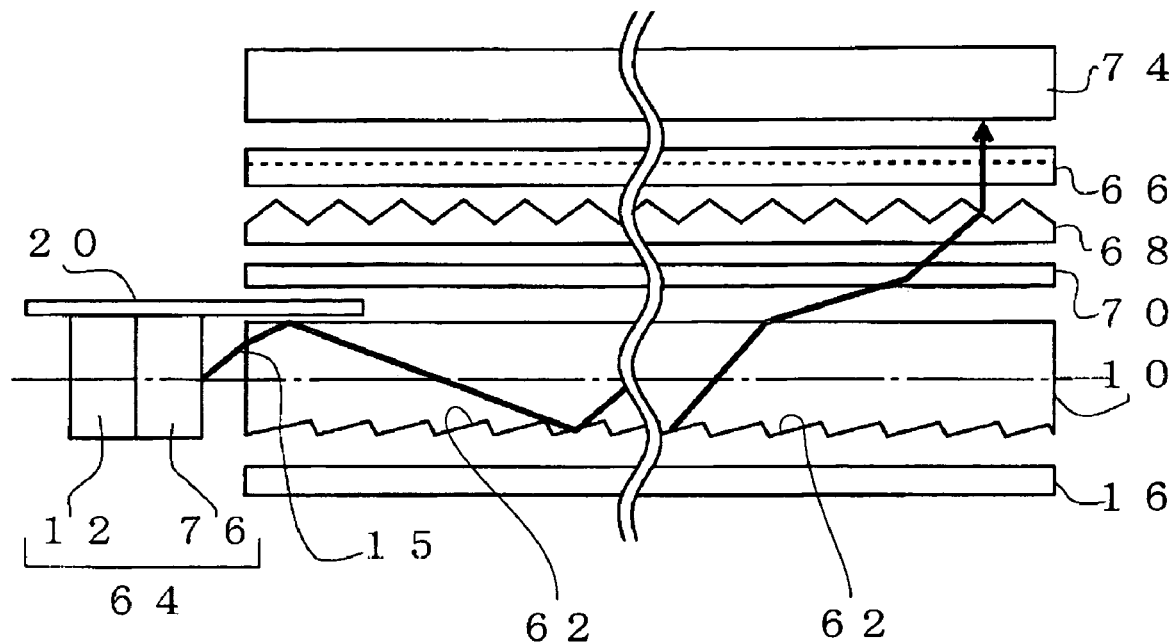
Figure 7B:
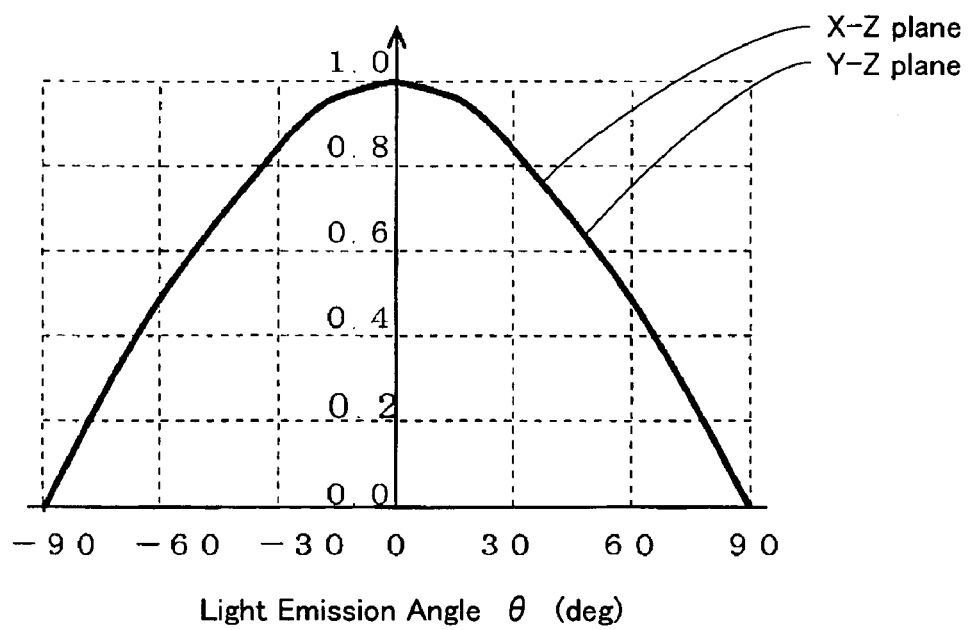
Figure 8A:
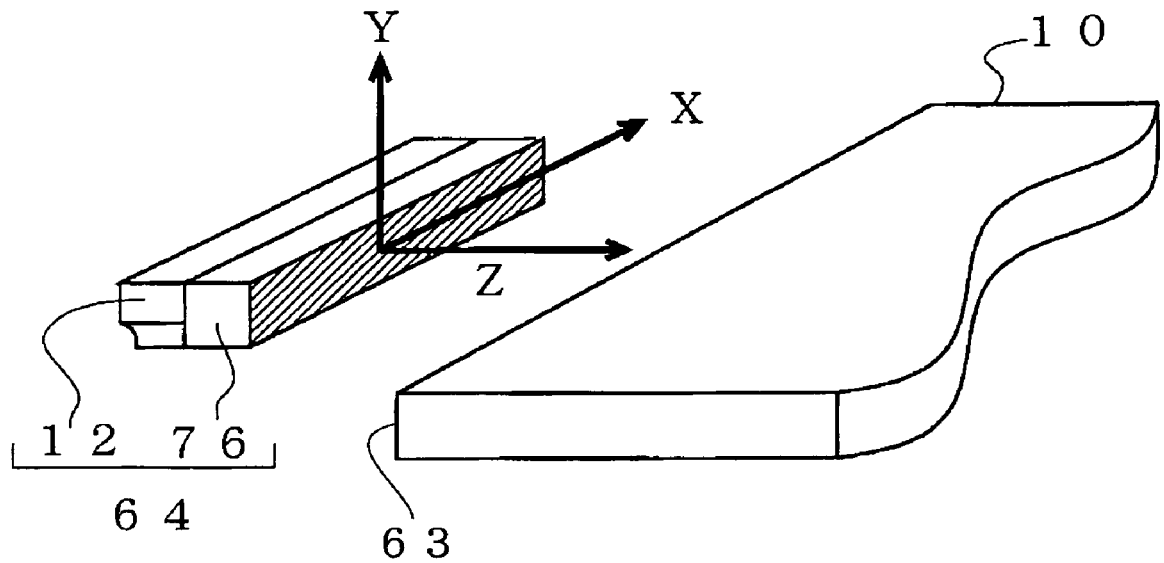
FIG. 8a is a schematic diagram for illustrating coordinate axes used in the present specification.
Figure 8B:
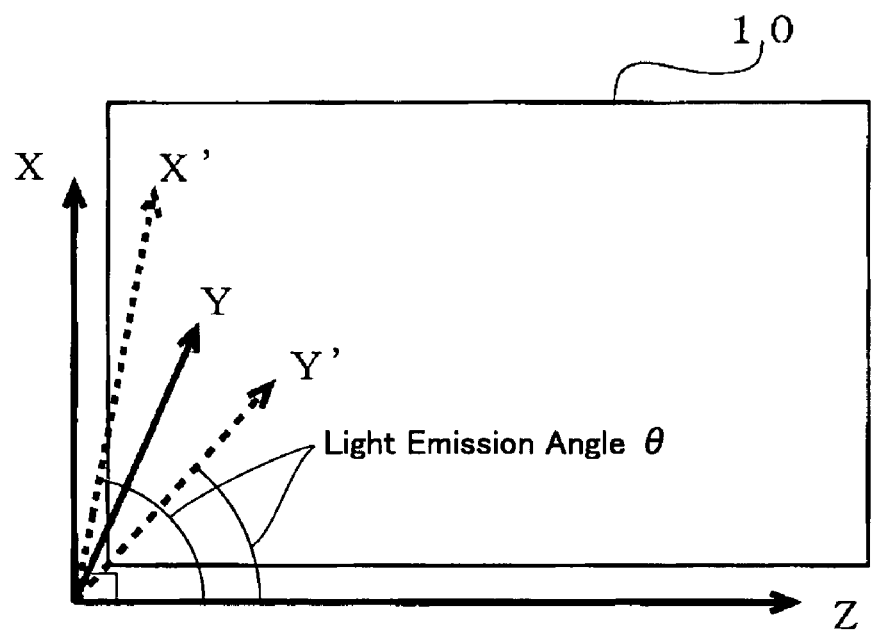

In this lighting device, a light guide plate 10 having reflective prisms formed on a bottom surface thereof is provided, in this illustration, on the right side with respect to LED units 13 arranged as in FIG. 6a (only one of which is shown in the figure). The LED unit 13 comprises a substrate section 12 and an emission section 14. A flexible printed circuit 20 is attached on the top of the substrate section 12 of the LED unit 13 and electrically connected with terminals of at least one LED chip embedded in the emission section. A reflective plate 16 is disposed beneath the LED unit 13 and the light guide plate 10. A reflective sheet 18 is further disposed between and in contact with the emission section 14 of the LED unit 13 and the flexible printed circuit 20.

It should be noted that the reflective plate 16 lies below the entire bottom surface of the light guide plate and extends to the underside of the substrate section 12. It is important that the reflective plate 16 lies below the bottom surface of the emission section 14.

Further, a length, L3, of the reflective sheet 18 is set longer than a length, L2, of the emission section 14 in the longitudinal direction of the light guide plate. Specifically, the length L3 is at least two times as long as the length L2. This allows larger quantity of light to be collected, which would otherwise leak without entering or out of the light guide plate 10.

With this configuration, the light 38 as shown in FIG. 5a that is not to be used for illumination can be reflected on the reflective sheet 18 back to the light guide plate 10 as denoted by 24 in FIG. 1a, while the light 40 as shown in FIG. 5a that is not to be used for illumination can be also reflected on the reflective plate 16 back to the light guide plate 10, as denoted by 26 in FIG. 1a, so that the both portions of light can be used for illumination. Thus, the light exiting from the top and the bottom surfaces of the LED unit are reflected on the reflective members disposed in vicinity of the top and the bottom surfaces, so that a larger quantity of light can be supplied to the light guide plate. In this manner, the lighting device of the present invention can improve the efficiency in using the light from the light source significantly. The reflective sheet 18 may be made by cutting a preformed large-size reflective sheet which may be economically prepared by using various kinds of reflective materials, so that the reflective sheet 18 can be advantageous as compared with a case where such a reflective member as the reflective sheet 18 is formed through the mirror-surface finishing as is in FIG. 9. The preformed large-size reflective sheet may be a sheet made of PET film with a silver film thereon and a coating layer formed thereon or a reflective sheet referred to as "ESR" available from Sumitomo 3M Limited. The ESR, because of its non-conductivity, has an advantage that the LED electrode cannot be electrically shorted.

Accordingly, the lighting device according to the present invention can accomplish significant superiority in the efficiency in using the light, or the brightness, and the cost performance as well.

Since the lighting device of the present invention can increase the efficiency in using the light in this manner, even if the thickness of the light guide plate is reduced by around half, the lighting device can still illuminate at substantially the same level as that achieved by the conventional device and thus can realize the low-profile, bright lighting device with low production cost.

Figure 1B:
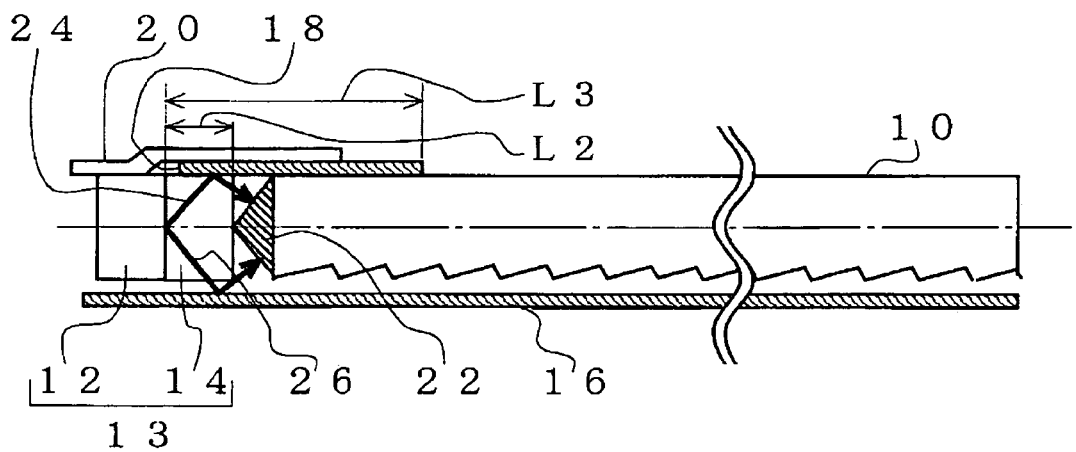

In FIG. 1a, there is provided a gap between a flat upper surface of the emission section 14 of the LED unit 13 and the flexible printed circuit 20, while in FIG. 1b, there is provided no gap between the emission section 14 and the flexible printed circuit 20 but instead the reflective sheet 18 is inserted therebetween. The reflective sheet is so thin that it can be inserted as the above manner.

Figure 2A:
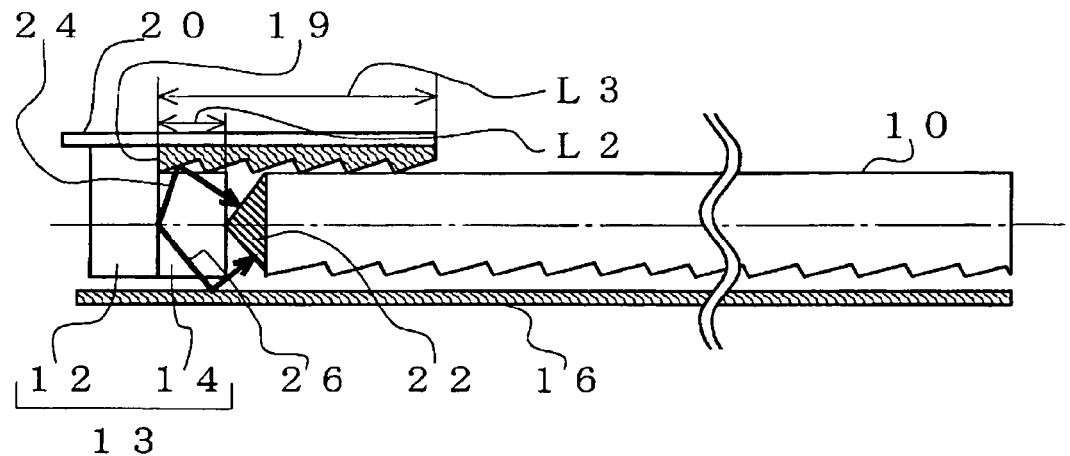
FIG. 2a shows a lighting device of a second embodiment of the present invention.

FIG. 2a shows another aspect of a lighting device according to the present invention. This lighting device is different from that shown in FIG. 1a in the reflective layer 19, wherein reflective prisms are arranged on its surface facing the top side of the emission section of the LED unit, as illustrated. This is provided for the purpose of reflecting the light exiting from the top side of the emission section on the reflective layer 19, and this configuration can prevent light from leaking without entering the light guide plate, as the light reflected on the reflective layer 19 and returned to the light guide plate is reflected repeatedly within the light guide plate until the light can finally exit for illumination.

Figure 2B:
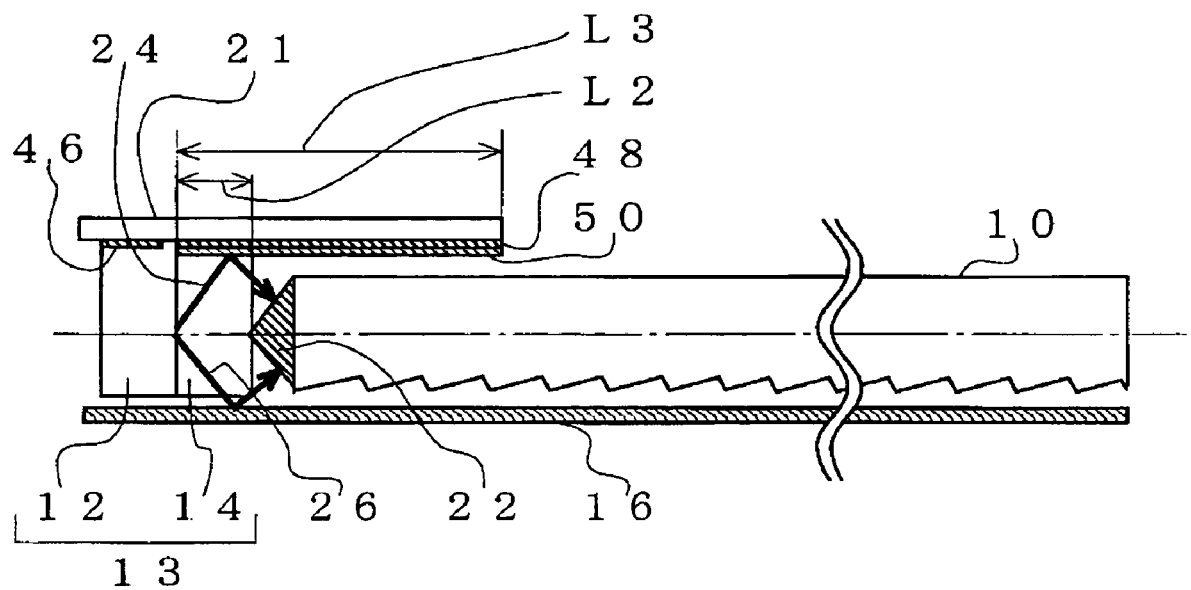
FIG. 2b shows a lighting device of a third embodiment of the present invention.

FIG. 2b shows a lighting device according to another embodiment of the present invention, which comprises terminals 46 and 48 on an bottom surface of a flexible printed circuit 21, wherein the terminal 46 is adapted to be connected with the LED chip and the terminal 48 is adapted not to be connected with the LED chip but has a reflective layer 50 formed thereon. This can reduce a number of parts required for assembling the device. The terminals 46 and 48 may be constructed as a single unit, and the reflective layer 50 may be formed over the both terminals 46 and 48.

Figure 3:
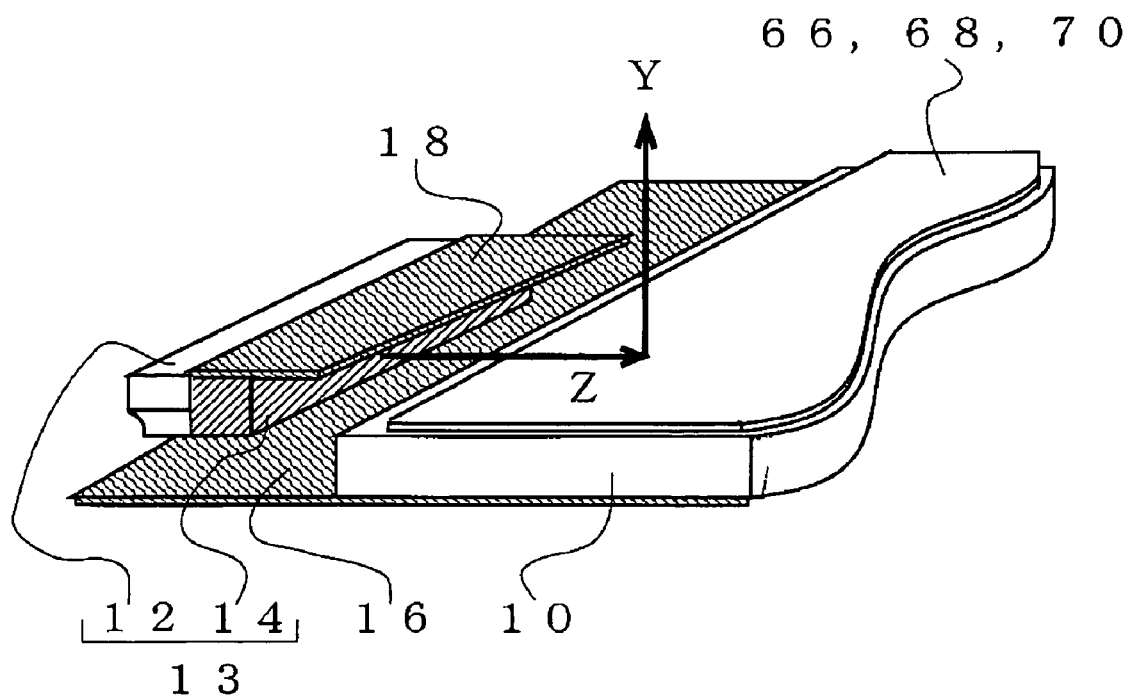
FIG. 3 is a perspective view illustrating main components of a lighting device according to the present invention.

FIG. 3 is a perspective view of main components of a lighting device according to the above described embodiments of the present invention. As shown in FIG. 3, the lighting device includes the reflective sheet 18 and the reflective plate 16 over and below the LED unit, respectively, so that the light from the LED unit can be directed toward an end surface of the light guide plate 10 effectively. Films for collecting the light are disposed above the light guide plate 10, including, for example, a diffusion plate 70, and prism films 68, 66 which are disposed in respective orientations perpendicular to each other, so that the light exited from the LED unit 13 along the Z-axis can be deflected upward in the light guide plate and thereby turn to be the exiting light along the Y-axis with the aid of the light guide plate 10 and the films 70, 68 and 66 so as to illuminate a non-self-emitting display (not shown) disposed on the films. Thus the light from the LED unit can illuminate the non-self-emitting display in an efficient manner, and so according to the present invention it becomes possible to provide the low-profile and inexpensive lighting device with a high illumination intensity.

Although the present invention has been described in terms of specific embodiments, it is anticipated that alternations and modifications thereof will no doubt become apparent to those skilled in the art. It is therefore intended that the following claims be interpreted as covering all such alternations and modifications as fall within the true spirit and scope of the invention.

What is claimed is:

1. A lighting device comprising:
   a light guide plate having a top surface serving as a light exiting surface, a bottom surface serving as a reflective surface and a side surface serving as a light entering surface;
   at least one light emitting diode unit disposed adjacent to said light entering surface of said light guide plate, comprising:
   a light-pervious emission section comprising a front surface facing said light entering surface of said light guide plate, a back surface opposite to said front surface, a top surface, a bottom surface and right and left side surfaces;
   at least one light emitting diode chip embedded within said emission section and emitting light out from at least the front, top, bottom, right side and left side surfaces of the emission section; and,
   a flat reflective member provided separately from said light emitting diode unit and disposed over only the top surface of said emission section, said flat reflective member being at least as wide as the front surface of the emission section and extending to overlap the top surface of the emission section and a part of the top surface of said light guide plate, and the top surface of the emission section being covered with the flat reflective member which reflects the light emitted out of the top surface of the emission section back into the light guide plate, while the right and left side surfaces are left uncovered such that light is permitted to exit out of the emission section from the right and left side surfaces.

2. A lighting device in accordance with claim 1, in which said emission section has a rectangular configuration in cross-section defined by the top, bottom, right side and left side surfaces.

3. A lighting device in accordance with claim 1, further comprising a reflective plate disposed right beneath said bottom surface of said light guide plate and the bottom surface of the emission section.

4. A lighting device in accordance with claim 1, in which said reflective member comprises a reflective sheet.

5. A lighting device in accordance with claim 1, in which said reflective member has a surface facing said emission section on which an array of reflective prisms that deflect light exiting from said top surface of said emission section.

6. A lighting device in accordance with claim 1, further comprising a flexible printed circuit board electrically connected to said light emitting diode chip, said flexible printed circuit board extending toward and in parallel with said top surface of said light guide plate, wherein said reflective member comprises a reflective sheet disposed between and in contact with said flexible printed circuit board and said light emitting diode unit.

7. A lighting device in accordance with claim 1, further comprising a flexible printed circuit board attached to and electrically connected to said light emitting diode chip through said substrate, said flexible printed circuit board extending to overlap a part of said top surface of said light guide plate, wherein said reflective member is formed on a surface of said flexible printed circuit board facing to-said light emitting diode unit.

8. An electronic device comprising:
   a non-self-emitting display; and,
   a lighting device in accordance with claim I disposed adjacent to said non-self-emitting display to illuminate the non-self-emitting display from below.

9. A lighting device in accordance with claim 1, wherein the emission section is transparent.

* * * * *

UNITED STATES PATENT AND TRADEMARK OFFICE
CERTIFICATE OF CORRECTION

PATENT NO. : 7,488,103 B2 Page 1 of 1
APPLICATION NO. : 11/517775
DATED : February 10, 2009
INVENTOR(S) : Kiyokazu Watanabe et al.

It is certified that error appears in the above-identified patent and that said Letters Patent is hereby corrected as shown below:

On the Title Page

Item (75), delete "Fujiyoshida" and substitute --Fujiyoshida-shi-- in its place.

Item (57), line 4, under "ABSTRACT", after "surface; and" delete "a" and substitute --at-- in its place.

Item (57), line 11, under "ABSTRACT", after "over a top" insert --surface--.

In the Claims

In column 8, claim 5, line 38, immediately after "of said emission section" delete "." and insert --into the light guide plate are formed.--.

In column 8, claim 7, line 53, after "circuit board facing" delete "to-said" and substitute --said-- in its place.

In column 8, claim 8, line 57, after "in accordance with" delete "claim I" and substitute --Claim 1-- in its place.

Signed and Sealed this

Fifteenth Day of September, 2009

David J. Kappos
*Director of the United States Patent and Trademark Office*